United States Patent
Zielnicki et al.

(10) Patent No.: US 11,914,431 B2
(45) Date of Patent: Feb. 27, 2024

(54) METHOD OF CREATING MECHANICAL STRENGTH AND INDUSTRIAL DESIGN AESTHETICS FOR HINGE AREA OF COMPUTING DEVICES

(71) Applicant: Dell Products L.P., Round Rock, TX (US)

(72) Inventors: Steven J. Zielnicki, Round Rock, TX (US); Kevin L. Kamphuis, Round Rock, TX (US)

(*) Notice: Subject to any disclaimer, the term of this patent is extended or adjusted under 35 U.S.C. 154(b) by 70 days.

(21) Appl. No.: 17/382,673

(22) Filed: Jul. 22, 2021

(65) Prior Publication Data
US 2023/0023895 A1 Jan. 26, 2023

(51) Int. Cl.
| G06F 1/16 | (2006.01) |
| B21D 22/00 | (2006.01) |
| B21D 53/40 | (2006.01) |
| B23C 3/12 | (2006.01) |
| H05K 5/02 | (2006.01) |

(52) U.S. Cl.
CPC ........... *G06F 1/1681* (2013.01); *B21D 22/00* (2013.01); *B21D 53/40* (2013.01); *B23C 3/12* (2013.01); *H05K 5/0226* (2013.01)

(58) Field of Classification Search
CPC .... G06F 1/1681; G06F 1/1616; G06F 1/1613; B21D 22/02
See application file for complete search history.

(56) References Cited

U.S. PATENT DOCUMENTS

| 7,886,903 | B1* | 2/2011 | Wurzelbacher, Jr. ............... G06F 1/1616 206/320 |
| 8,776,358 | B2* | 7/2014 | Gotham .................. H04R 3/00 29/34 R |
| 9,416,916 | B2* | 8/2016 | Jenkins ................. G06F 1/1616 |
| 10,509,443 | B2* | 12/2019 | Honma ..................... B32B 5/12 |
| 11,099,649 | B2* | 8/2021 | Ligtenberg ............ G06F 3/0416 |
| 2002/0133930 | A1* | 9/2002 | Chern ................... G06F 1/1679 29/525.01 |
| 2005/0199032 | A1* | 9/2005 | Krajewski ............ B21D 22/022 72/379.2 |
| 2006/0139793 | A1* | 6/2006 | Ser ........................ B21D 11/18 29/603.03 |

(Continued)

FOREIGN PATENT DOCUMENTS

| CN | 103231002 B | * | 2/2015 | |
| KR | 20180111604 A | * | 10/2018 | .............. B21J 13/02 |

(Continued)

OTHER PUBLICATIONS

KR20180111604A machine translation (Year: 2018).*
CN103231002B Machine Translation (Year: 2015).*

*Primary Examiner* — Michael W Hotchkiss
(74) *Attorney, Agent, or Firm* — Terrile, Cannatti & Chambers, LLP; Emmanuel A. Rivera

(57) ABSTRACT

A hinge area and processes of forming the hinge area are described. The hinge area is part of cover of a laptop computer. A material used for the cover is of a certain thickness. Stamping and forming a shape that defines the hinge area is performed on the material. The top of the shape is cut to provide for sides of the hinge area. Squeeze forging operations are performed to thicken the sides, and CNC machining is further performed on the sides.

9 Claims, 6 Drawing Sheets

(56) References Cited

U.S. PATENT DOCUMENTS

| | | | | |
|---|---|---|---|---|
| 2010/0091442 | A1* | 4/2010 | Theobald | H05K 5/04 |
| | | | | 361/679.55 |
| 2011/0089792 | A1* | 4/2011 | Casebolt | G06F 1/1616 |
| | | | | 156/151 |
| 2012/0090371 | A1* | 4/2012 | Radlmayr | B21D 22/208 |
| | | | | 72/364 |
| 2014/0102162 | A1* | 4/2014 | Morgenstern | B23P 17/00 |
| | | | | 29/559 |
| 2014/0262876 | A1* | 9/2014 | Bates | G06F 1/1632 |
| | | | | 206/320 |
| 2015/0022961 | A1* | 1/2015 | Jenkins | G06F 1/1616 |
| | | | | 248/688 |
| 2016/0169444 | A1* | 6/2016 | Jenkins | G06F 1/1637 |
| | | | | 248/688 |
| 2016/0179136 | A1* | 6/2016 | Senatori | G06F 1/1662 |
| | | | | 72/352 |
| 2018/0093312 | A1* | 4/2018 | Ran | B23C 3/12 |
| 2018/0218859 | A1* | 8/2018 | Ligtenberg | H01H 13/86 |
| 2021/0165448 | A1* | 6/2021 | Turner | A45C 11/00 |
| 2022/0023935 | A1* | 1/2022 | Chang | B21J 5/008 |
| 2022/0225522 | A1* | 7/2022 | Hosokai | G06F 1/1652 |
| 2022/0371069 | A1* | 11/2022 | Sun | B23C 3/12 |

FOREIGN PATENT DOCUMENTS

| | | | | |
|---|---|---|---|---|
| WO | WO-2011047094 | A2 * | 4/2011 | ....... B29C 45/14311 |
| WO | WO-2021040719 | A1 * | 3/2021 | ........... G06F 1/1616 |

* cited by examiner

METHOD OF CREATING MECHANICAL STRENGTH AND INDUSTRIAL DESIGN AESTHETICS FOR HINGE AREA OF COMPUTING DEVICES

BACKGROUND OF THE INVENTION

Field of the Invention

The present invention relates to the hinge areas of computing devices. More specifically, embodiments of the invention provide processes for forged insert molding of hinge areas and other areas where actual and perceived metal thickness is desired.

Description of the Related Art

Typically, hinge areas computing devices, such as laptop or notebook computers, are CNC (computer numerical controlled) machined from a solid piece of metal, such as aluminum. A relatively thicker piece of material provides a quality and aesthetically pleasing look.

The hinge areas provide for hinge assemblies to be inserted, such as 360 degree hinges of "2 in 1" laptop computers. Although the hinge assemblies are inserted, the hinge areas are still visible to users. The thickness at the hinge areas can provide for mechanical strength and the desirable aesthetic look of a quality product. In certain cases, the thickness is dictated by mechanical strength and industrial design requirements.

CNC machining of a single piece metal having a consistence thickness (e.g., 10 mm) used for a laptop computer cover and its hinge areas, can involve costly processes (e.g., machining time) and waste of material. Not only do hinge areas have to be CNC machined, but the area to support the laptop computer display may have to be CNC machined. Material that is CNC machined away is wasted.

SUMMARY OF THE INVENTION

A process and a hinge area are disclosed for forming the hinge area for a computing device which comprise the steps of: stamping a shape from a material with a certain thickness; forming the inside of the hinge area in the shape; cutting the top of the shape to provide for sides of the hinge area; performing one or more squeeze forging operations to thicken the sides of the hinge area; and CNC machining the sides of the hinge area.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Implementations described herein provide for mechanical strengthening of hinge areas having a perceived aesthetic look of a thicker piece of CNC machined material where a thinner piece of material is used. For example, an approximately 1.20 mm thick piece of aluminum is used for a laptop computer display cover. Processes described herein provide for an approximate thickness of 5.00 mm for the hinge area. The use of thinner material can save CNC machining cost (time) and material waste compared to the CNC machining of a thicker material for the laptop display cover.

In certain implementations, a sheet of material, such as aluminum (e.g., 5052-H32 aluminum) is used for a cover of a laptop computer. Metal forming is performed for hinge areas. Included in the metal forming provides for material around the hinge area(s) of the cover to be drawn up using stamping processing. A shape is formed on the hinge areas that includes sides and a top. The sides of the formed shape are the sides of the hinge area and are processed to have a desired thickness. The top of the formed shape is trimmed off while pressure on the sides is maintained to keep the sides from falling. Squeeze forging is performed to increase the thickness. CNC machining can be performed for perimeter forging and allow for insert molding. Hinge areas of laptop computer covers are described as an example; however, it is expected that the processes described herein can be applied to other areas of other devices which may require the use of thinner materials to be shaped to provide thicker and more aesthetically pleasing areas.

Figure 1:
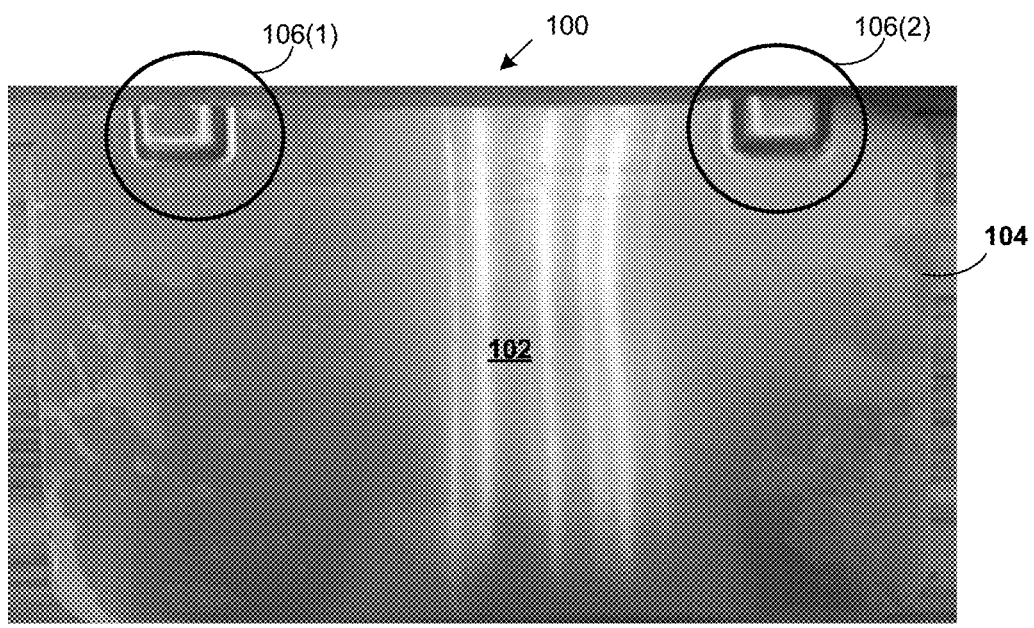
FIG. 1 illustrates a laptop computer cover with formed 70 degree shapes for hinge areas.

FIG. 1 shows a laptop computer cover with formed 70 degree shapes for hinge areas. A top view 100 of a laptop computer cover 102 is shown. In certain implementations, the laptop computer cover 102 has a thickness 104 of approximately 1.2 mm. The laptop computer cover 102 can be a single sheet of material, such as aluminum (e.g., 5052-H32 aluminum). In order to prevent tearing of the material, an intermediate shape 106(1) and 106(2) are formed. The shapes 106 can be formed using known stamping methods that can include the use of die stamps.

A side cutout view 108 shows shape 106 which can be formed at an intermediate angle 110, for example 70 degrees. A die stamp 112 is shown in view 108.

Figure 2:
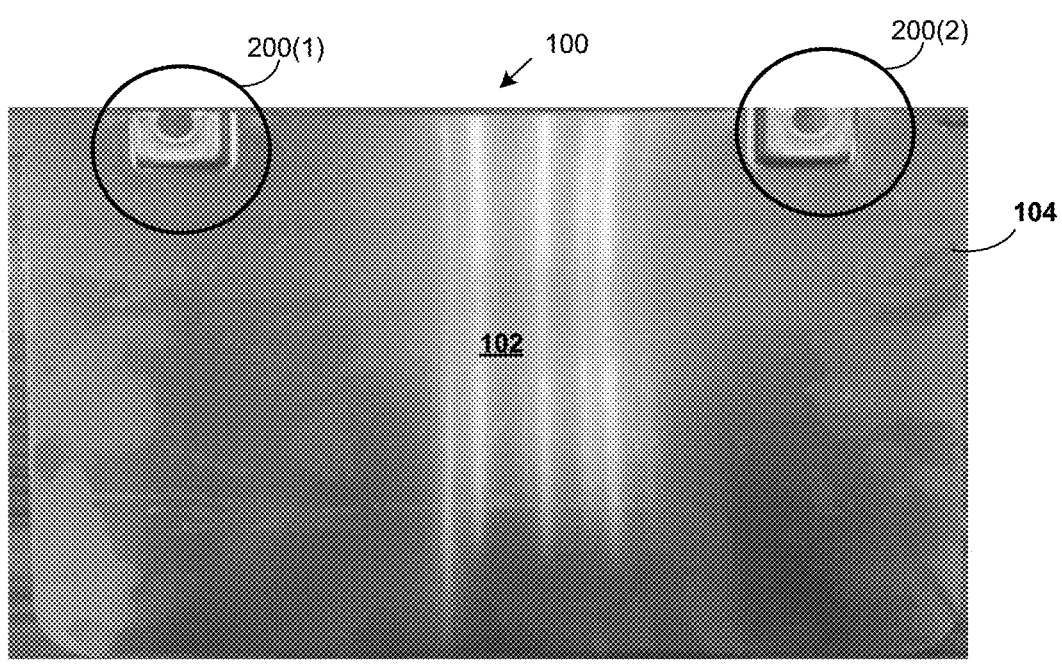
FIG. 2 illustrates a laptop computer cover with formed 90 degree shape for hinge areas.

FIG. 2 shows a laptop computer cover with formed 90 degree shape for hinge areas. Formed shapes 200(1) and 200(2) are the hinge areas of the laptop computer cover 102. The shapes 200 can be formed using known stamping methods that can include the use of die stamps. A side cutout view 202 shows shape 200 that is formed at a final angle 204, for example 90 degrees. A die stamp 206 is shown in view 202.

Figure 3:
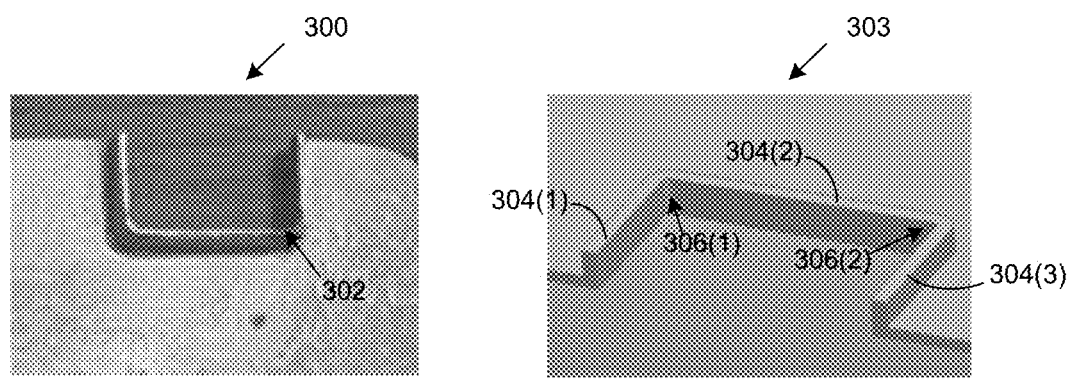
FIG. 3 illustrates trimming or blanking of formed shape for a hinge area.

FIG. 3 shows trimming or blanking of formed shape for a hinge area. A top of view 300 shows a formed shape 302 with the top trimmed off. The trimming process can be performed using known methods which provide removing the top of the shape while supporting the drawn/formed shape. A top side view 303 shows sides 304(1), 304(2) and 304(3) of the hinge area. In order to prevent weakening in the corners 306(1) and 306(2) of the hinge area, squeeze forging processes are performed as further described herein.

Figure 4:
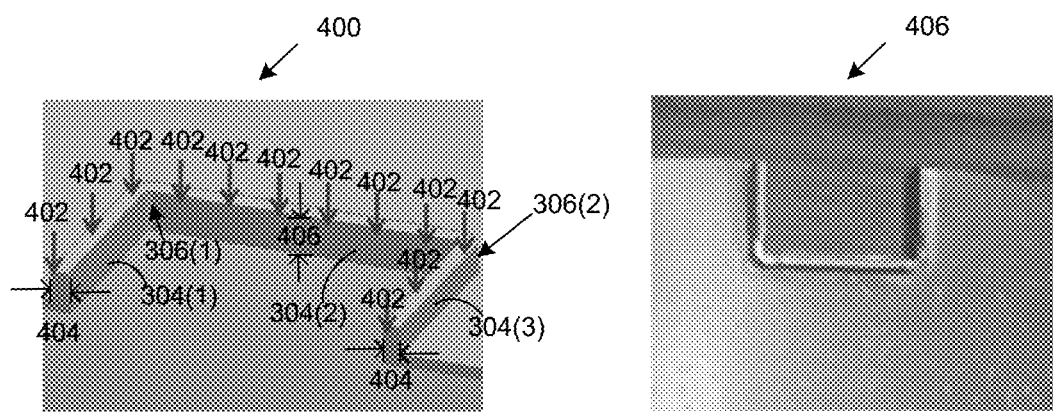
FIG. 4 illustrates squeeze forging of walls of a hinge area.

FIG. 4 shows squeeze forging of walls of a hinge area. Using typical metal forming process in the hinge area on internal radii presents issues. Material can thin in the corners 306, making the corners 306 weak. By squeeze forging the perimeter separate from the hinge area the needed wall height can be attained. A top side view 400 shows forces 402 applied in known squeeze forging processes to walls or sides 304. Squeeze forging the hinge wall 304 thickens the walls 304. Several separate squeeze forging operations can be performed, for example three squeeze forging operations. For example, starting with a wall thickness 404 of 1.2 mm, after all squeeze forging operations, a wall thickness 404 of 1.6 to 1.8 mm can be achieved. An example wall 304 thickness 406 of 5.0 mm can be achieved after all squeeze forging operations. A top view 406 shows hinge area after squeeze forging.

Figure 5:
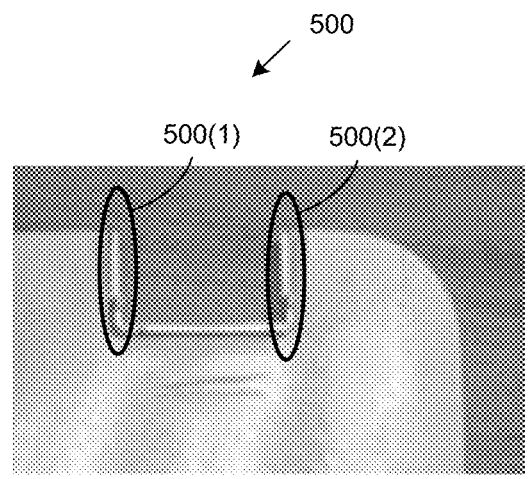
FIG. 5 illustrates side wall cutting of a hinge area.

FIG. 5 shows side wall cutting of a hinge area. Implementations can provide for additional finishing by cutting or CNC machining side walls 500(1) and 500(2) of the hinge area. In certain implementations, CNC machining is performed to allow for forging and for details for insert or over molding.

Figure 6:
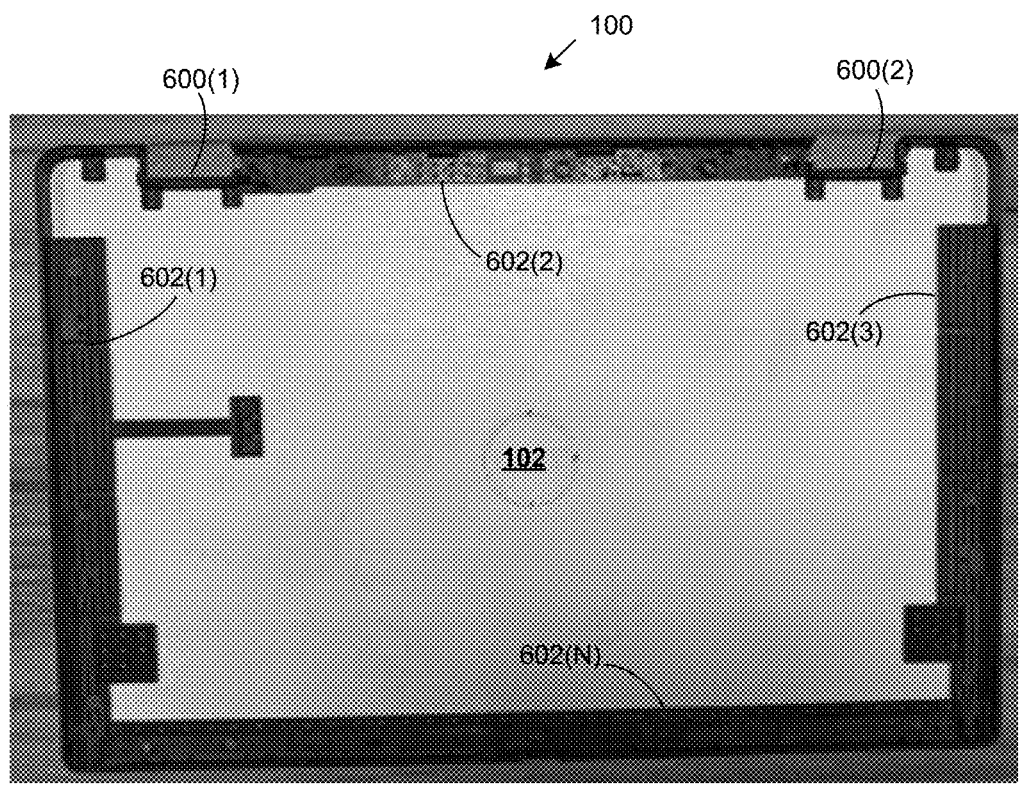
FIG. 6 illustrates providing insert molding to hinge areas and laptop computer cover.

FIG. 6 shows providing insert or over molding to hinge areas and laptop computer cover. Insert molding 600(1) and 602(2) can be applied to the hinge areas. Additional insert molding 602(1) to 602(N) can be applied to support other components that are mounted/added to the laptop computer cover 102. Components such as a display. Insert or over molding 600 and 602 can be made of a plastic which can be painted.

Figure 7:
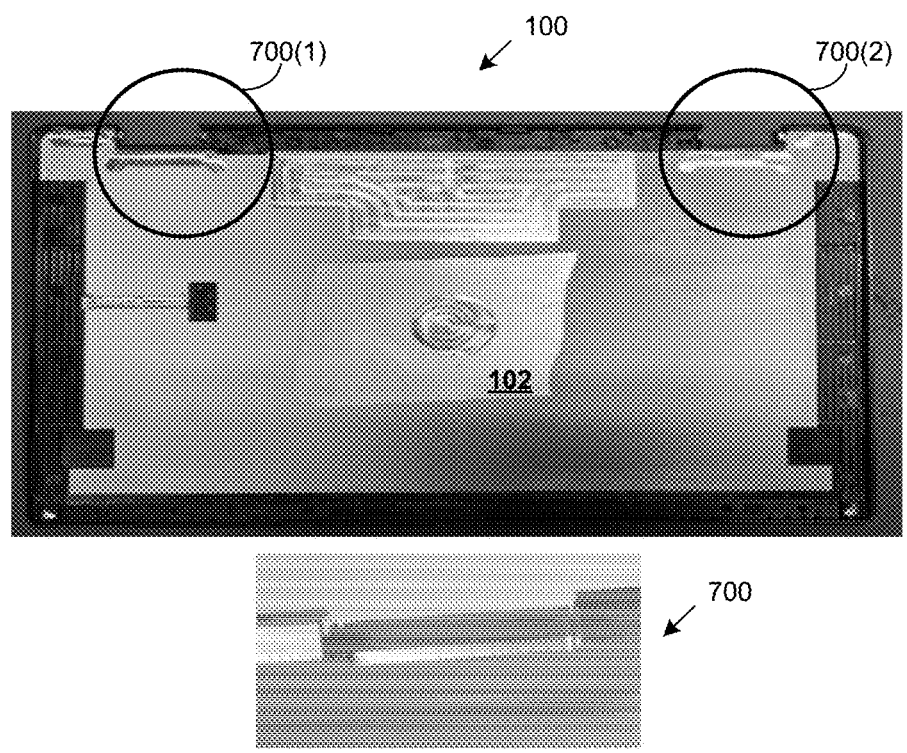
FIG. 7 illustrates providing CNC machining to hinge areas.

FIG. 7 shows providing CNC machining to hinge areas. In certain implementations, additional CNC machining 700(1) and 700(2) is performed on the hinge areas. The CNC machining can be performed to provide a final configuration or shape of the hinge areas.

Figure 8:
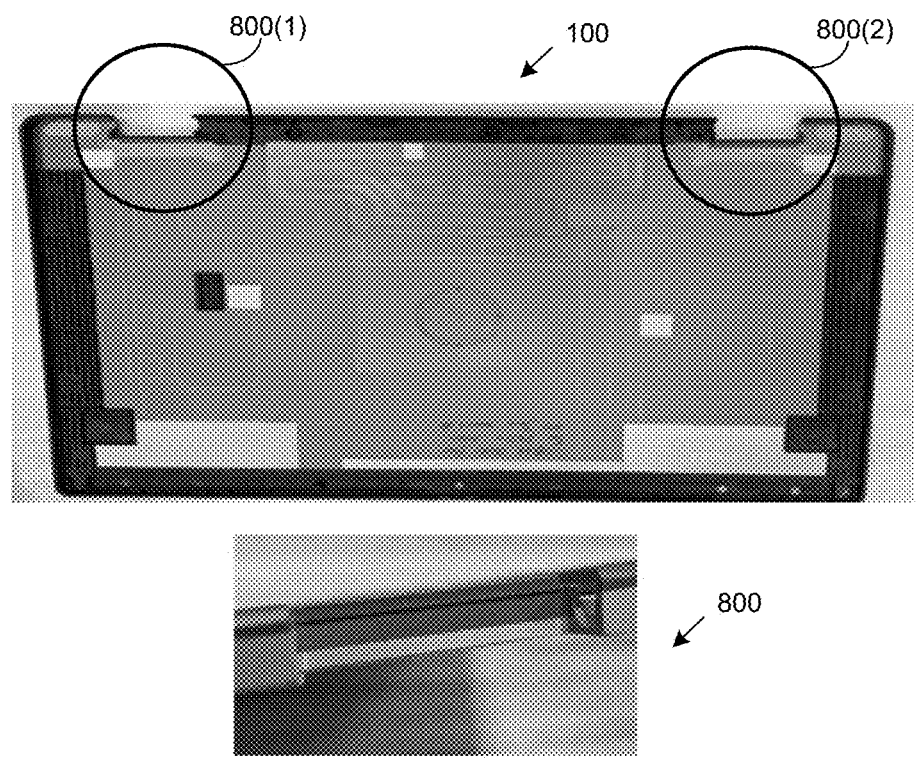
FIG. 8 illustrates anodizing of the hinge areas.

FIG. 8 shows anodizing of the hinge areas. To provide an additional finished and aesthetic look to the metallic portions of the hinge area, anodizing can be performed. Element 800 shows anodized hinge areas.

Figure 9:
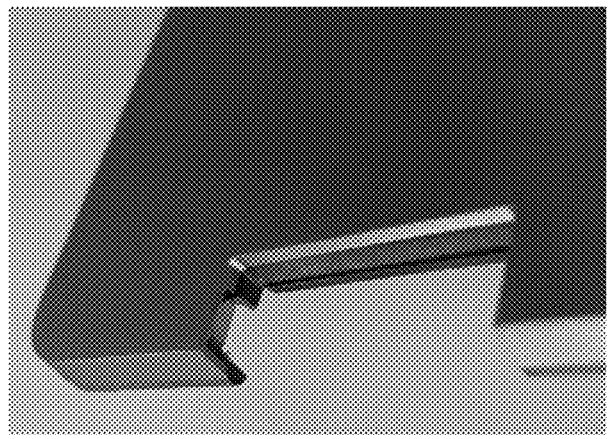
FIG. 9 illustrates completed hinge areas.
Figure 9:
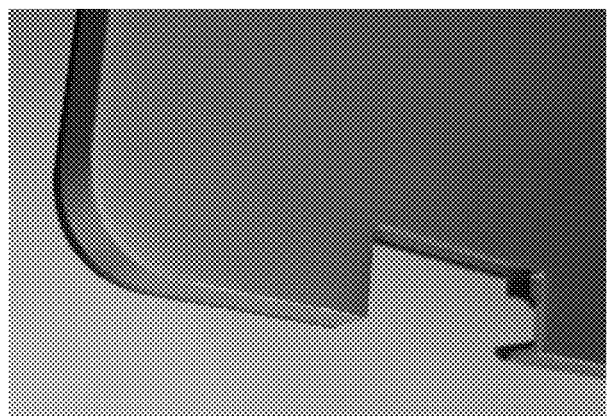
Figure 9:
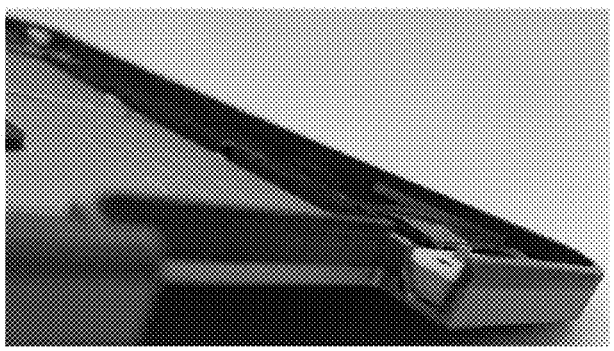

FIG. 9 shows completed hinge areas. 900 is a top side view of a completed hinge area. 902 is another top side view of completed hinge area. 904 is a bottom side view of a completed hinge areas.

Figure 10:
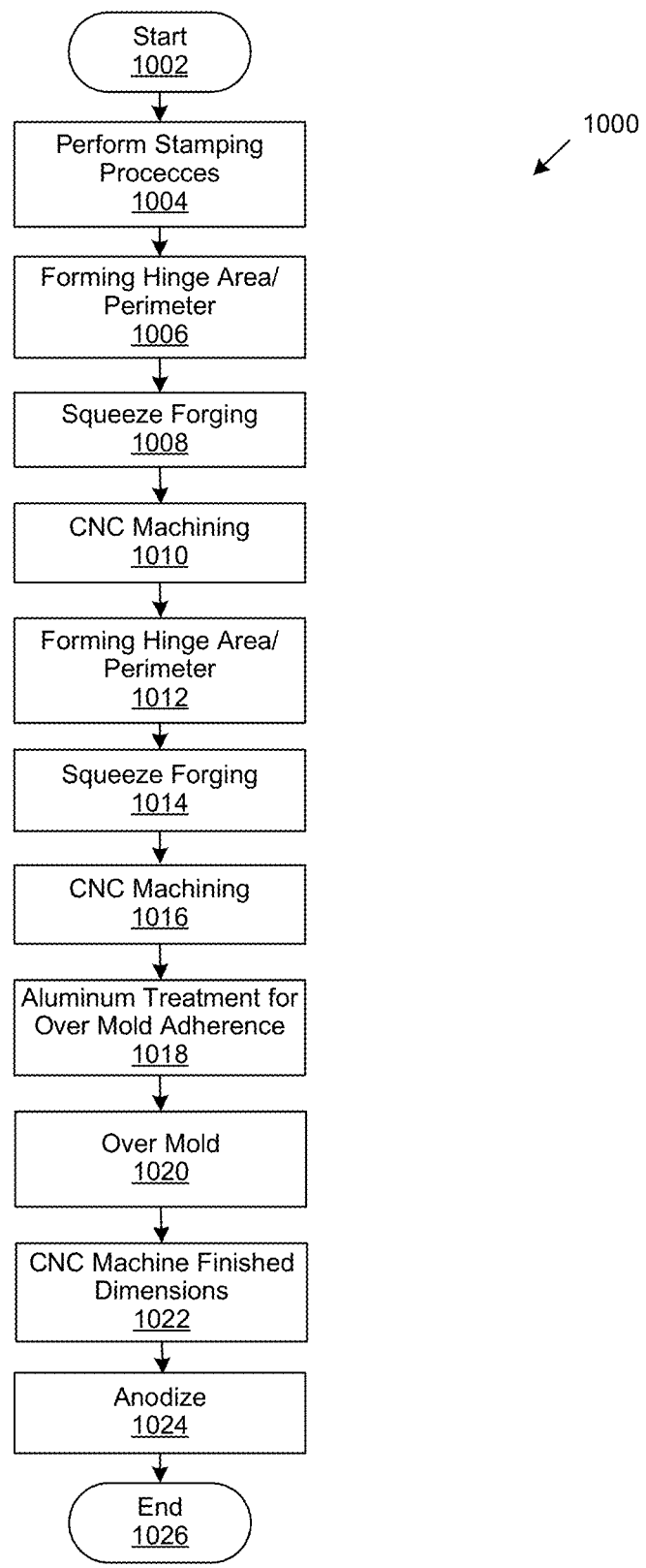
FIG. 10 is generalized flowchart for browser based polling to support multi-user single page web applications.

FIG. 10 is a generalized flowchart 1000 for mechanical strengthening of hinge areas having a perceived aesthetic look of a thicker piece of CNC machined material where a thinner piece of material is used. The order in which the method is described is not intended to be construed as a limitation, and any number of the described method blocks may be combined in any order to implement the method, or alternate method.

At step 1002, the process 1000 starts. At step 1004, stamping processes are performed on a sheet of material, such as a laptop computer cover 102. As discussed, the material can be a uniform thickness, such as 1.2 mm. For example, the material can be aluminum (e.g., 5052-H32 aluminum). Die stamping can be performed. In various implementations, intermediate stamping can be performed, where a first shape at 70 degrees is stamped and formed. A second and final shape at 90 degrees is stamped and formed.

At step 1006, forming the inside of hinged area or forming the perimeter of the hinge area is performed as discussed. At step 1008, a squeeze forging operation as discussed to increase wall thickness and/or for design (industrial design) requirements. At step 1010, CNC machining is performed. In certain implementations, CNC machining is performed to allow for hinge area perimeter forging.

At step 1012 forming the perimeter of the hinge area or the inside of the hinge area is performed, as discussed. At step 1014, in certain implementations, another squeeze forging operation can be performed to further increase wall thickness and/or for design (industrial design) requirements.

At step 1016, CNC machining is performed for the forged perimeter and inside forged area of the hinged area for mechanical interlock strength of insert or over molding. At step 1018, aluminum treating is performed for insert or over mold adherence. At step 1020, insert or over molding is performed as discussed. In particular, the inset or over molding is performed based on mechanical and/or design (industrial design) requirements.

At step 1022, CNC machining is performed to achieve final dimensions. At step 1024, an anodizing process can be performed to provide a desired finish. At step 1024, the hinge area is complete, and the process 1000 ends.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A method of forming a hinge area for a computing device comprising the steps of:
    stamping a shape from a material with a certain thickness, wherein the stamping is die stamping with a first step that stamps and forms a first shape at 70 degrees and a second step that stamps and forms a final shape at 90 degrees;
    forming the inside of the hinge area in the shape;
    cutting a top of the shape to provide for sides of the hinge area;
    performing at least two squeeze forging operations to thicken the sides of the hinge area, wherein a first squeeze forging operation starts with a wall thickness of up to 1.2 mm, and a second squeeze forging operation increases the wall thickness to a finish of 1.8 mm, modifying by the forging wall height to up to 5.0 mm; and
    CNC machining the sides of the hinge area.

2. The method of claim 1, wherein a height of the sides of the hinge area is thicker than the certain thickness of the material.

3. The method of claim 1, wherein the material is part of a cover for a laptop computer.

4. The method of claim 1, wherein the stamping and forming includes an intermediate process to prevent tearing of the material.

5. The method of claim 1 further comprising forming a perimeter of the hinge area.

6. The method of claim 1 further comprising CNC machining to allow for perimeter forging.

7. The method of claim 1 further comprising anodizing the material of the hinge area.

8. The method of claim 1, wherein the material is aluminum, and further comprising treating the aluminum for over molding.

9. The method of claim 8 further comprising over molding the hinge area and other areas of the material.

\* \* \* \* \*